(12) United States Patent
Kimura

(10) Patent No.: US 11,594,669 B2
(45) Date of Patent: Feb. 28, 2023

(54) PIEZOELECTRIC THIN FILM ELEMENT

(71) Applicant: TDK Corporation, Tokyo (JP)

(72) Inventor: Junichi Kimura, Tokyo (JP)

(73) Assignee: TDK Corporation, Tokyo (JP)

( * ) Notice: Subject to any disclaimer, the term of this patent is extended or adjusted under 35 U.S.C. 154(b) by 397 days.

(21) Appl. No.: 16/647,491

(22) PCT Filed: Sep. 11, 2018

(86) PCT No.: PCT/JP2018/033670
§ 371 (c)(1),
(2) Date: Mar. 14, 2020

(87) PCT Pub. No.: WO2019/059051
PCT Pub. Date: Mar. 28, 2019

(65) Prior Publication Data
US 2020/0274052 A1 Aug. 27, 2020

(30) Foreign Application Priority Data
Sep. 22, 2017 (JP) .............................. JP2017-182726

(51) Int. Cl.
*H01L 41/04* (2006.01)
*H01L 41/047* (2006.01)
*H01L 41/083* (2006.01)
*H01L 41/187* (2006.01)

(52) U.S. Cl.
CPC ........ *H01L 41/0478* (2013.01); *H01L 41/083* (2013.01); *H01L 41/187* (2013.01)

(58) Field of Classification Search
None
See application file for complete search history.

(56) References Cited

U.S. PATENT DOCUMENTS

| 2004/0135144 A1* | 7/2004 | Yamada ................. H03H 9/564 257/59 |
| 2005/0093157 A1 | 5/2005 | Noguchi et al. |
| 2005/0189846 A1 | 9/2005 | Saito et al. |
| 2005/0191792 A1 | 9/2005 | Noguchi et al. |

(Continued)

FOREIGN PATENT DOCUMENTS

| CN | 1638036 A | 7/2005 |
| CN | 1638271 A | 7/2005 |

(Continued)

OTHER PUBLICATIONS

International Preliminary Report on Patentability dated Apr. 2, 2020 for PCT/JP2018/033670.

(Continued)

*Primary Examiner* — Erica S Lin
(74) *Attorney, Agent, or Firm* — Faegre Drinker Biddle & Reath LLP

(57) ABSTRACT

Provided is a piezoelectric thin film device in which lattice mismatch between a piezoelectric thin film and a lower electrode layer (first electrode layer) is reduced. A piezoelectric thin film device 10 comprises a first electrode layer 6a and a piezoelectric thin film 2 laminated directly on the first electrode layer 6a; the first electrode layer 6a includes an alloy composed of two or more metal elements; the first electrode layer 6a has a body-centered cubic lattice structure; and the piezoelectric thin film 2 has a wurtzite structure.

13 Claims, 2 Drawing Sheets

(56) References Cited

U.S. PATENT DOCUMENTS

Figure 1:
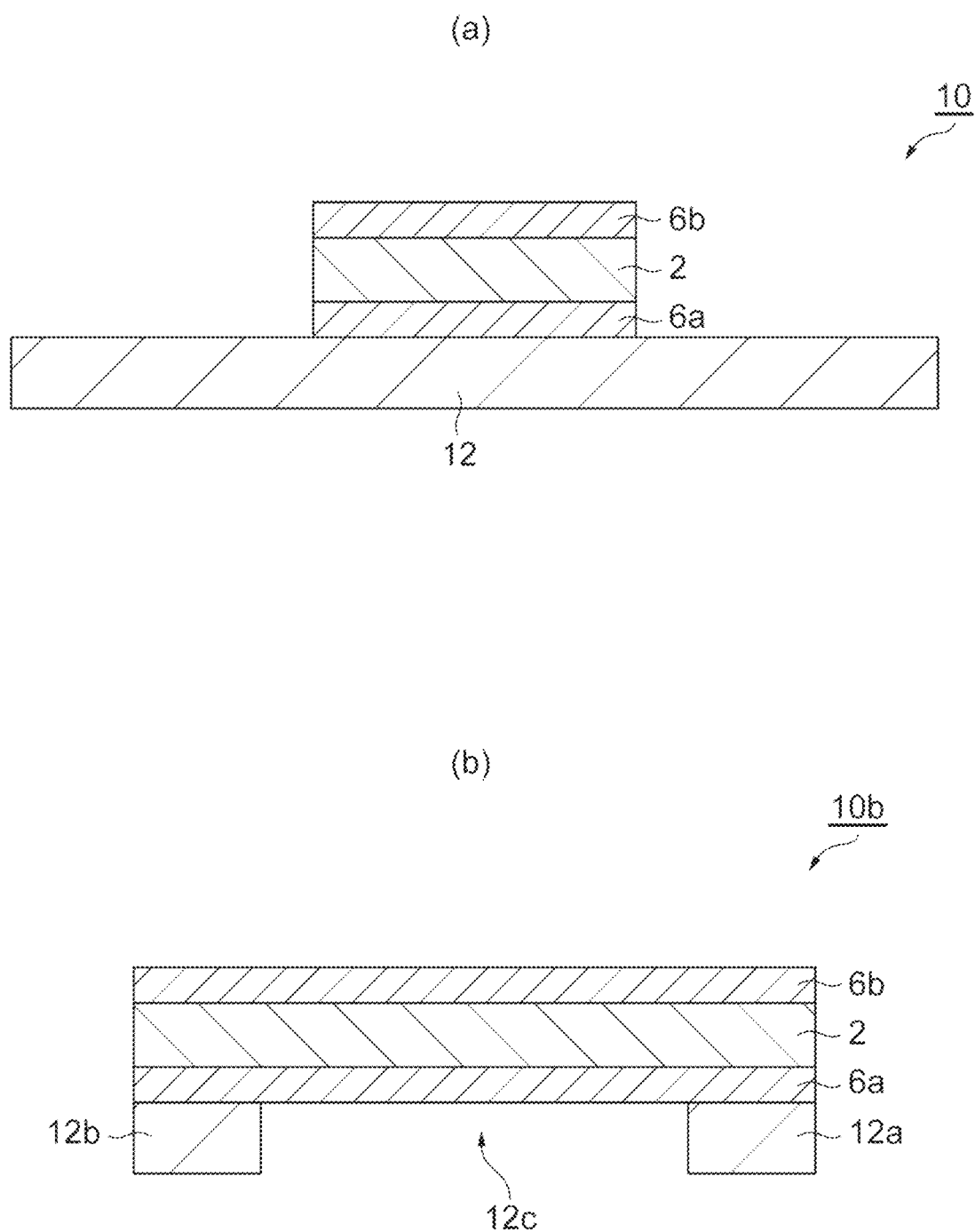

2005/0237132 A1 10/2005 Sano et al.
2007/0115078 A1 5/2007 Sano et al.

FOREIGN PATENT DOCUMENTS

| CN | 1691498 A | 11/2005 |
| JP | 2005-136115 A | 5/2005 |
| JP | 2005-197983 A | 7/2005 |
| JP | 2005-198117 A | 7/2005 |
| JP | 2015-128091 A | 7/2015 |

OTHER PUBLICATIONS

Naik, Rajan S. et al., "Measurements of the Bulk, C-Axis Electromechanical Coupling Constant as a Function of AlN Film Quality," IEEE Transactions on Ultrasonics, Ferroelectrics, and Frequency Control, vol. 47, No. 1, Jan. 2000, pp. 292-296.

* cited by examiner

PIEZOELECTRIC THIN FILM ELEMENT

TECHNICAL FIELD

The present invention relates to a piezoelectric thin film element (piezoelectric thin film device).

BACKGROUND ART

In recent years, MEMS (Micro Electro Mechanical Systems) have attracted attention. MEMS (Micro Electro Mechanical Systems) are devices in which mechanical component parts, electronic circuits, and the like are integrated on one substrate by microfabrication technology. A piezoelectric thin film is used in MEMS having a function such as a sensor, a filter, a harvester, or an actuator. In manufacturing MEMS using a piezoelectric thin film, a lower electrode layer, a piezoelectric thin film, and an upper electrode layer are laminated on a substrate such as silicon or sapphire. Through subsequent processes such as subsequent microfabrication, patterning, or etching, MEMS having arbitrary characteristics can be obtained. Selecting the piezoelectric thin film having excellent characteristics can improve the characteristics of the piezoelectric thin film device such as MEMS and miniaturize the device.

As a piezoelectric thin film used for the piezoelectric thin film device, for example, AlN (aluminum nitride), ZnO (zinc oxide), CdS (cadmium sulfide), $LiNbO_3$ (lithium niobate), and PZT (lead zirconate titanate) are known. For a piezoelectric thin film having a wurtzite structure such as AlN, ZnO, and CdS, a positive piezoelectric constant (d constant) is small, but relative dielectric constant ($\varepsilon_r$) is small as compared with PZT having a perovskite structure. Therefore, the piezoelectric thin film having a wurtzite structure is a good candidate of a material for a piezoelectric thin film device whose piezoelectric output coefficient (g constant=d/$\varepsilon_0\varepsilon_r$, where $\varepsilon_0$ is the dielectric constant in vacuum) is considered in design (refer to the following Non Patent Literature 1).

CITATION LIST

Non Patent Literature

Non Patent Literature 1: Rajan S. Naik et al., IEEE TRANSACTIONS ON ULTRASONICS, FERROELECTRICS AND FREQUENCY CONTROL, 2000, vol. 47, p. 292-296

SUMMARY OF INVENTION

Technical Problem

However, as described below, there are some problems in the piezoelectric thin film device using the piezoelectric thin film having the wurtzite structure.

The most serious problem is the degradation of the piezoelectric characteristics derived from the crystal orientation. The orientation in which the piezoelectric characteristics of the piezoelectric thin film having the wurtzite structure are developed is the (001) plane of the wurtzite structure, and not only the presence of the non-(001) plane of the wurtzite structure but also fluctuation in the orientation of the (001) plane degrade the piezoelectric characteristics. Therefore, it is important to suppress the fluctuation of the crystal orientation of the piezoelectric thin film having the wurtzite structure and to enhance the orientation of the (001) plane.

For example, in the method for manufacturing an AlN thin film described in the above Non-Patent Literature 1, various conditions such as the input power to the sputtering target and the residual gas in the sputtering apparatus are changed in order to enhance the crystal orientation of the AlN thin film.

However, when the piezoelectric thin film having the wurtzite structure is laminated directly on the lower electrode layer as in the case of the AlN thin film described in the above Non Patent Literature 1, lattice mismatch between the AlN thin film and the lower electrode layer tends to occur. Lattice mismatch degrades the crystal orientation of the piezoelectric thin film. The degradation of the crystal orientation also degrades the piezoelectric characteristics of the piezoelectric thin film. The lattice mismatch also increases residual stress in the piezoelectric thin film. The residual stress causes cracks (cracking) in the piezoelectric thin film. Furthermore, the lattice mismatch degrades the surface smoothness of the piezoelectric thin film. The degradation of the surface smoothness lowers the insulation resistance of the piezoelectric thin film.

The present invention has been performed in view of the above circumstances, and the object thereof is to provide a piezoelectric thin film device in which lattice mismatch between the piezoelectric thin film and the lower electrode layer (first electrode layer) is reduced.

Solution to Problem

The piezoelectric thin film device according to one aspect of the present invention comprises a first electrode layer and a piezoelectric thin film laminated directly on the first electrode layer, wherein the first electrode layer includes an alloy composed of two or more metal elements, the first electrode layer has a body-centered cubic lattice structure, and the piezoelectric thin film has a wurtzite structure.

In one aspect of the present invention, the alloy may include two or more elements selected from the group consisting of Mo, W, V, Cr, Nb, and Ta.

In one aspect of the present invention, the alloy may be represented by any of the following Chemical Formula 3A, Chemical Formula 3B, Chemical Formula 3C, Chemical Formula 3D, Chemical Formula 3E, and Chemical Formula 3F, and the piezoelectric thin film may include aluminum nitride.

where in the above Chemical Formula 3A, 0<x<0.65.

where in the above Chemical Formula 3B, 0<x<0.82.

where in the above Chemical Formula 3C, 0<x<0.18.

where in the above Chemical Formula 3D, 0.10<x<0.87.

where in the above Chemical Formula 3E, 0<x<0.37.

where in the above Chemical Formula 3F, 0.05<x<0.46.

In one aspect of the present invention, the alloy may be represented by any of the following Chemical Formula 4A, Chemical Formula 4B, Chemical Formula 4C, Chemical Formula 4D, and Chemical Formula 4E, and the piezoelectric thin film may include zinc oxide.

$$Mo_{(1-y)}W_y \quad \text{Chemical Formula 4A}$$

where in the above Chemical Formula 4A, 0.90<y<1.0.

$$Mo_{(1-y)}Nb_y \quad \text{Chemical Formula 4B}$$

where in the above Chemical Formula 4B, 0.25<y<1.0.

$$Mo_{(1-y)}Ta_y \quad \text{Chemical Formula 4C}$$

where in the above Chemical Formula 4C, 0.25<y<1.0.

$$W_{(1-y)}Nb_y \quad \text{Chemical Formula 4D}$$

where in the above Chemical Formula 4D, 0<y<1.0.

$$W_{(1-y)}Ta_y \quad \text{Chemical Formula 4E}$$

where in the above Chemical Formula 4E, 0<y<1.0.

In one aspect of the present invention, the alloy may include three or more elements selected from the group consisting of Mo, W, V, Cr, Nb, and Ta.

In one aspect of the present invention, the alloy may be represented by any of the following Chemical Formula 6A, Chemical Formula 6B, and Chemical Formula 6C, and the piezoelectric thin film may include aluminum nitride.

$$Mo_xW_yV_z \quad \text{Chemical Formula 6A}$$

where in the above Chemical Formula 6A, 0<x<1.0, 0<y<0.90, and 0<z<0.87.

$$Mo_xW_yCr_z \quad \text{Chemical Formula 6B}$$

where in the above Chemical Formula 6B, 0<x<1.0, 0<y<0.95, and 0<z<0.46.

$$Mo_xW_yNb_z \quad \text{Chemical Formula 6C}$$

where in the above Chemical Formula 6C, 0.35<x<1.0, 0<y<0.65, and 0<z<0.18.

In one aspect of the present invention, the alloy may be represented by any one of the following Chemical Formula 7A and Chemical Formula 7B, and the piezoelectric thin film may include zinc oxide.

$$Mo_xW_yNb_z \quad \text{Chemical Formula 7A}$$

where in the above Chemical Formula 7A, 0<x<0.75, 0<y<1.0, and 0<z<1.0.

$$Mo_xW_yTa_z \quad \text{Chemical Formula 7B}$$

where in the above Chemical Formula 7B, 0<x<0.75, 0<y<1.0, and 0<z<1.0.

In one aspect of the present invention, the (110) plane of the body-centered cubic lattice structure of the first electrode layer may be oriented in the normal direction of the interface between the first electrode layer and the piezoelectric thin film.

In one aspect of the present invention, the degree of lattice mismatch between the first electrode layer and the above piezoelectric thin film may be 0% or more and 2% or less.

The piezoelectric thin film device according to one aspect of the present invention may further comprise a substrate, and the first electrode layer may be laminated directly on the above substrate.

In one aspect of the present invention, the full width at half maximum of the rocking curve of the (002) plane of the wurtzite structure of the piezoelectric thin film may be 0° or more and 2.0° or less.

Advantageous Effects of Invention

According to the present invention, provided is a piezoelectric thin film device in which lattice mismatch between a piezoelectric thin film and a lower electrode layer (first electrode layer) is reduced.

BRIEF DESCRIPTION OF DRAWINGS (a) of FIG. 1 is a schematic cross-sectional view of a piezoelectric thin film device according to one embodiment of the present invention, and (b) of FIG. 1 is a schematic cross-sectional view of the piezoelectric thin film device according to another embodiment of the present invention.

Figure 2:
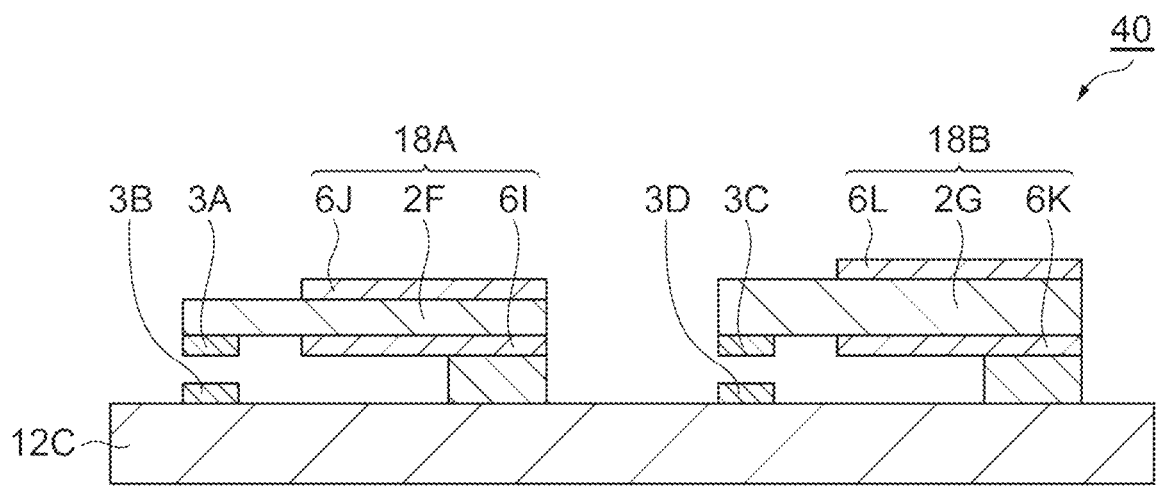

FIG. 2 is a schematic cross-sectional view of the piezoelectric thin film device according to one embodiment of the present invention.

DESCRIPTION OF EMBODIMENTS

Hereinafter, suitable embodiments of the present invention will be described with reference to the drawings as required. However, the present invention is not limited to the following embodiments at all. In the drawings, the same or equivalent components are denoted by the same reference numerals.

As shown in (a) of FIG. 1, the piezoelectric thin film device 10 according to the present embodiment comprises a substrate 12, a first electrode layer 6a laminated on the substrate 12, a piezoelectric thin film 2 laminated directly on the first electrode layer 6a, and a second electrode layer 6b laminated on the piezoelectric thin film 2. However, the substrate 12 and the second electrode layer 6b are not essential to the piezoelectric thin film device according to the present invention. The first electrode layer 6a may be rephrased as a lower electrode layer. The second electrode layer 6b may be rephrased as an upper electrode layer.

The first electrode layer 6a includes an alloy composed of two or more metal elements, and the first electrode layer 6a has a body-centered cubic lattice structure. In other words, the alloy included in the first electrode layer 6a is composed of two or more metal elements, and has a body-centered cubic lattice structure. The first electrode layer 6a may consist of only the above alloy having a body-centered cubic lattice structure.

The piezoelectric thin film 2 has a wurtzite structure. That is, the piezoelectric thin film 2 may include a piezoelectric composition having a wurtzite crystal structure. The piezoelectric composition included in the piezoelectric thin film 2 may include at least one piezoelectric composition selected from the group consisting of, for example, AlN (aluminum nitride), ZnO (zinc oxide), ZnS (zinc sulfide), ZnTe (zinc telluride), CdS (cadmium sulfide), CdSe (cadmium selenide), and CdTe (cadmium telluride). The piezoelectric thin film 2 may consist of only the above piezoelectric composition having a wurtzite structure. The piezoelectric thin film 2 may include other additive elements other than the above elements constituting the piezoelectric thin film 2, as long as the lattice match between the piezoelectric thin film 2 and the first electrode layer 6a is not impaired. The piezoelectric thin film 2 may be composed of a plurality of piezoelectric layers having a wurtzite structure. Another piezoelectric thin film having a wurtzite structure may be disposed between the piezoelectric thin film 2 and the first electrode layer 6a. Another piezoelectric thin film having a wurtzite structure may be disposed between the piezoelectric thin film 2 and the second electrode layer 6b. The second electrode layer 6b may be laminated directly on the piezoelectric thin film 2.

The wurtzite structure of the piezoelectric thin film 2 tends to match the body-centered cubic lattice structure of the first electrode layer 6a. For example, the absolute value of the degree of lattice mismatch between the first electrode layer 6a and the piezoelectric thin film 2 can be 0% or more and 2% or less, or 0.04% or more and 1.76% or less. Therefore, the (001) plane (or (002) plane), which develops the piezoelectric characteristics of the piezoelectric thin film 2 having the wurtzite structure, tends to be oriented in the normal direction of the surface of the substrate 12, and the crystal orientation of the piezoelectric thin film 2 is improved. That is, in the present embodiment, fluctuation in the orientation of the (001) plane is suppressed in the normal direction of the surface of the substrate 12, and the orientation of the non-(001) plane in the same direction is suppressed. The improvement of the crystal orientation of the piezoelectric thin film 2 improves the piezoelectric characteristics of the piezoelectric thin film 2. The normal direction of the surface of the substrate 12 may be rephrased as the normal direction of the interface between the first electrode layer 6a and the piezoelectric thin film 2. The degree of lattice mismatch $\Delta a/a$ between the first electrode layer 6a and the piezoelectric thin film 2 is defined by the following Formula 1.

[Formula 1]

$$\frac{\Delta a}{a} = \frac{a_{ele.} - a_{wurt.}}{a_{ele.}} \quad (1)$$

In Formula 1, $a_{ele.}$ is the lattice constant of the body-centered cubic lattice structure of the first electrode layer 6a at the film forming temperature T° C. (for example, 300° C.) of the piezoelectric thin film 2. When the lattice constant of the body-centered cubic lattice structure of the first electrode layer 6a at room temperature (27° C.) is represented as $a_{ele.0}$ and the thermal expansion coefficient of the first electrode layer 6a is represented as $CTE_{ele.}$, $a_{ele.}$ at T° C. is equal to $a_{ele.0} + CTE_{ele.} \times (T-27)$. $a_{wurt.}$ is the lattice constant of the wurtzite structure of the piezoelectric thin film 2 at the film forming temperature (for example, 300° C.) of the piezoelectric thin film 2. When the lattice constant of the wurtz type structure of the piezoelectric thin film 2 at room temperature (27° C.) is represented as $a_{wurt.0}$ and the thermal expansion coefficient of the piezoelectric thin film 2 is represented as $CTE_{wurt.}$, $a_{wurt.}$ at T° C. is equal to $a_{wurt.0} + CTE_{wurt.} \times (T-27)$.

The full width at half maximum (FWHM) of the rocking curve of the (002) plane of the wurtzite structure of the piezoelectric thin film 2 may be 0° or more and 2.0° or less. As the absolute value of the degree of lattice mismatch between the first electrode layer 6a and the piezoelectric thin film 2 is smaller, the (002) plane of the piezoelectric thin film 2 tends to be more oriented, and the full width at half maximum of the rocking curve is smaller. As the full width at half maximum of the rocking curve is smaller, $d_{33}$ of the piezoelectric thin film device 10 tends to be larger.

The (110) plane of the body-centered cubic lattice structure of the first electrode layer 6a may be oriented in the normal direction of the interface between the first electrode layer 6a and the piezoelectric thin film 2. The atomic arrangement in the (110) plane of the body-centered cubic lattice structure tends to match the atomic arrangement in the (001) plane of the wurtzite structure. Therefore, the (001) plane of the piezoelectric thin film 2 tends to be oriented parallel to the (110) plane of the first electrode layer 6a. For example, a plurality of columnar crystals of the piezoelectric composition having the oriented (001) plane tend to grow uniformly on the (110) plane of the first electrode layer 6a, and the crystal orientation of the entire piezoelectric thin film 2 tends to be improved.

Reducing the lattice mismatch between the first electrode layer 6a and the piezoelectric thin film 2 also reduces the residual stress in the piezoelectric thin film 2. Reducing the residual stress also suppresses cracks in the piezoelectric thin film 2 to improve the piezoelectric characteristics of the piezoelectric thin film 2. Suppressing the cracks in the piezoelectric thin film 2 suppresses peeling of the piezoelectric thin film 2 from the first electrode layer 6a and improves the yield in manufacturing the piezoelectric thin film 2. As a reference example, residual stress $\sigma$ (unit: GPa) in the case where the substrate 12 is a Si substrate, the first electrode layer is W, and the piezoelectric thin film is AlN is represented by the following Formula 2. However, a piezoelectric thin film in which the first electrode layer consists only of W is out of the technical scope of the present invention.

[Formula 2]

$$\sigma = \frac{E}{1+v}[\varepsilon_{misfit} + \varepsilon_{thermal}] \quad (2)$$

$$= \frac{E}{1+v}\left[\frac{a_{ele.} - a_{AlN}}{a_{ele.}} + (\alpha_{AlN} - \alpha_{Si})\Delta T\right]$$

E in Formula 2 is the Young's modulus (unit: GPa) of the piezoelectric thin film 2. $v$ is the Poisson's ratio of the piezoelectric thin film 2. $a_{ele.}$ is the lattice constant of the first electrode layer (W). $a_{AlN}$ is the lattice constant of the piezoelectric thin film (AlN). $(a_{ele.} - a_{AlN})/a_{ele.}$ is the degree of lattice mismatch between the first electrode layer (W) and the piezoelectric thin film (AlN). $\alpha_{AlN}$ is the thermal expansion coefficient of the piezoelectric thin film (AlN) and is about $4.2 \times 10^{-6}/°$ C. $\alpha_{Si}$ is the thermal expansion coefficient of the silicon substrate (Si) and is about $3.0 \times 10^{-6}/°$ C. $\varepsilon_{misfit}$ is a factor derived from the degree of lattice mismatch between the first electrode layer (W) and the piezoelectric thin film (AlN). $\varepsilon_{thermal}$ is a factor derived from the difference in thermal expansion coefficients between the silicon substrate (Si) and the piezoelectric thin film (AlN). As shown in Formula 2, reducing the lattice mismatch between the first electrode layer (W) and the piezoelectric thin film (AlN) reduces the residual stress $\sigma$ in the piezoelectric thin film. Reducing the difference in thermal expansion coefficients between the silicon substrate (Si) and the piezoelectric thin film (AlN) reduces the residual stress $\sigma$ in the piezoelectric thin film. When the piezoelectric thin film is presumed to be formed at 300° C., $\varepsilon_{misfit}$ is about 2.52% and $\varepsilon_{thermal}$ is $3.28 \times 10^{-4}$%. These numerical values indicate that the lattice mismatch is the dominant factor for the residual stress of the piezoelectric thin film between the lattice mismatch and the thermal expansion coefficient difference.

The lattice mismatch between the first electrode layer 6a and the piezoelectric thin film 2 is reduced and thereby the surface of the piezoelectric thin film 2 tends to be smooth. The surface of the piezoelectric thin film 2 is the surface of the piezoelectric thin film 2 facing the second electrode layer 6b and is the back surface of the surface of the piezoelectric thin film 2 facing the first electrode layer 6a. The smoothness of the surface of the piezoelectric thin film 2 is improved and thereby the insulation resistance of the piezoelectric thin film 2 is increased. The reason is as follows.

When the degree of lattice mismatch between the first electrode layer 6a and the piezoelectric thin film 2 is large, the piezoelectric thin film 2 is formed by the Volmer-Weber type island growth and hence the surface of the piezoelectric thin film 2 becomes rough. When an electric field is applied to the piezoelectric thin film 2 whose surface is rough, the electric field distribution on the surface of the piezoelectric thin film 2 tends to be biased, and the electric field intensity on a local place (for example, a protrusion) of the surface of the piezoelectric thin film 2 tends to be excessively high. As a result, dielectric breakdown occurs in the piezoelectric thin film 2. On the other hand, when the degree of lattice mismatch between the first electrode layer 6a and the piezoelectric thin film 2 is small, the piezoelectric thin film 2 is formed by the Frank-Van der Merwe type layer-by-layer growth and hence the surface of the piezoelectric thin film 2 tends to be smooth. When an electric field is applied to the piezoelectric thin film 2 whose surface is smooth, the electric field distribution on the surface of the piezoelectric thin film 2 tends to be uniform. As a result, dielectric breakdown in the piezoelectric thin film 2 is unlikely to occur.

The alloy included in the first electrode layer 6a may include two or more elements selected from the group consisting of Mo (molybdenum), W (tungsten), V (vanadium), Cr (chromium), Nb (niobium), and Ta (tantalum). When the alloy is composed of these metal elements, the first electrode layer 6a tends to have a body-centered cubic lattice structure, and the lattice mismatch between the piezoelectric thin film 2 and the first electrode layer 6a tends to be reduced. As long as the lattice match between the piezoelectric thin film 2 and the first electrode layer 6a is not impaired, the first electrode layer 6a may include other additive elements other than the above metals constituting the alloy.

When oxygen ($O^{2-}$), which is a carrier of charge, is introduced and diffused from the first electrode layer 6a into the piezoelectric thin film 2 by application of an electric field to the piezoelectric thin film 2, a leak current tends to be generated via oxygen (carrier path) in the piezoelectric thin film 2, and dielectric breakdown in the piezoelectric thin film 2 tends to occur. However, when the alloy included in the first electrode layer 6a includes two or more elements selected from the group consisting of Mo, W, V, Cr, Nb, and Ta, the alloy is difficult to be oxidized. The hardly-oxidized alloy constitutes the first electrode layer 6a and thereby oxygen is unlikely to be introduced and diffused from the first electrode layer 6a into the piezoelectric thin film 2. As a result, the leak current in the piezoelectric thin film 2 is suppressed and dielectric breakdown in the piezoelectric thin film 2 is unlikely to occur.

When the piezoelectric thin film 2 includes aluminum nitride, the alloy included in the first electrode layer 6a may be represented by any of the following Chemical Formula 3A, Chemical Formula 3B, Chemical Formula 3C, Chemical Formula 3D, Chemical Formula 3E, and Chemical Formula 3F. When the alloy included in the first electrode layer 6a is represented by any of the following Chemical Formula 3A, Chemical Formula 3B, Chemical Formula 3C, Chemical Formula 3D, Chemical Formula 3E, and Chemical Formula 3F, a plurality of AlN columnar crystals having the oriented (001) plane tend to grow uniformly on the (110) plane of the first electrode layer 6a; the lattice mismatch between the piezoelectric thin film 2 (AlN) and the first electrode layer 6a tends to be reduced; and the absolute value of the degree of lattice mismatch tends to be 2% or less. Generally, the free energy change $\Delta G$ in the oxidation reaction of the alloy is a negative value, and as the absolute value of $\Delta G$ is larger, the alloy tends to be oxidized. That is, the alloy is stabilized thermodynamically by oxidation. Although the free energy change $\Delta G$ in the oxidation reaction of the alloy represented by any of the following Chemical Formula 3A, Chemical Formula 3B, Chemical Formula 3C, Chemical Formula 3D, Chemical Formula 3E, and Chemical Formula 3F is a negative value, the absolute value of the $\Delta G$ tends to be relatively small. Therefore, the alloy represented by any of the following Chemical Formula 3A, Chemical Formula 3B, Chemical Formula 3C, Chemical Formula 3D, Chemical Formula 3E, and Chemical Formula 3F is difficult to be oxidized, and tends to suppress the dielectric breakdown in the piezoelectric thin film 2. The Gibbs energy change $\Delta G$ in the oxidation reaction of the alloy represented by any of the following Chemical Formula 3A, Chemical Formula 3B, Chemical Formula 3C, Chemical Formula 3D, Chemical Formula 3E, and Chemical Formula 3F may be calculated from the known Ellingham diagram.

$$Mo_{(1-x)}W_x \qquad \text{Chemical Formula 3A}$$

where in the above Chemical Formula 3A, $0<x<0.65$.

$$Mo_{(1-x)}V_x \qquad \text{Chemical Formula 3B}$$

where in the above Chemical Formula 3B, $0<x<0.82$.

$$Mo_{(1-x)}Nb_x \qquad \text{Chemical Formula 3C}$$

where in the above Chemical Formula 3C, $0<x<0.18$.

$$W_{(1-x)}V_x \qquad \text{Chemical Formula 3D}$$

where in the above Chemical Formula 3D, $0.10<x<0.87$.

$$Mo_{(1-x)}Cr_x \qquad \text{Chemical Formula 3E}$$

where in the above Chemical Formula 3E, $0<x<0.37$.

$$W_{(1-x)}Cr_x \qquad \text{Chemical Formula 3F}$$

where in the above Chemical Formula 3F, $0.05<x<0.46$.

When the piezoelectric thin film 2 includes zinc oxide, the alloy included in the first electrode layer 6a may be represented by any of the following Chemical Formula 4A, Chemical Formula 4B, Chemical Formula 4C, Chemical Formula 4D, and Chemical Formula 4E. When the alloy included in the first electrode layer 6a is represented by any of the following Chemical Formula 4A, Chemical Formula 4B, Chemical Formula 4C, Chemical Formula 4D, and Chemical Formula 4E, a plurality of ZnO columnar crystals having the oriented (001) plane tend to grow uniformly on the (110) plane of the first electrode layer 6a; the lattice mismatch between the piezoelectric thin film 2 (ZnO) and the first electrode layer 6a tends to be reduced; and the absolute value of the degree of lattice mismatch tends to be 2% or less. Although the free energy change $\Delta G$ in the oxidation reaction of the alloy represented by any of the following Chemical Formula 4A, Chemical Formula 4B, Chemical Formula 4C, Chemical Formula 4D, and Chemical Formula 4E is a negative value, the absolute value of the $\Delta G$ tends to be relatively small. Therefore, the alloy represented by any of the following Chemical Formula 4A, Chemical Formula 4B, Chemical Formula 4C, Chemical Formula 4D, and Chemical Formula 4E is difficult to be oxidized, and tends to suppress the dielectric breakdown in the piezoelectric thin film 2. The Gibbs energy change $\Delta G$ in the oxidation reaction of the alloy represented by any of the following Chemical Formula 4A, Chemical Formula 4B, Chemical Formula 4C, Chemical Formula 4D, and Chemical Formula 4E may be calculated from the known Ellingham diagram.

$$Mo_{(1-y)}W_y \quad \text{Chemical Formula 4A}$$

where in the above Chemical Formula 4A, $0.90<y<1.0$.

$$Mo_{(1-y)}Nb_y \quad \text{Chemical Formula 4B}$$

where in the above Chemical Formula 4B, $0.25<y<1.0$.

$$Mo_{(1-y)}Ta_y \quad \text{Chemical Formula 4C}$$

where in the above Chemical Formula 4C, $0.25<y<1.0$.

$$W_{(1-y)}Nb_y \quad \text{Chemical Formula 4D}$$

where in the above Chemical Formula 4D, $0<y<1.0$.

$$W_{(1-y)}Ta_y \quad \text{Chemical Formula 4E}$$

where in the above Chemical Formula 4E, $0<y<1.0$.

The alloy included in the first electrode layer 6a may include three or more elements selected from the group consisting of Mo, W, V, Cr, Nb, and Ta.

When the piezoelectric thin film 2 includes aluminum nitride, the alloy included in the first electrode layer 6a may be represented by any of the following Chemical Formula 6A, Chemical Formula 6B, and Chemical Formula 6C. When the alloy included in the first electrode layer 6a is represented by any of the following Chemical Formula 6A, Chemical Formula 6B, and Chemical Formula 6C, a plurality of AlN columnar crystals having the oriented (001) plane tend to grow uniformly on the (110) plane of the first electrode layer 6a, the lattice mismatch between the piezoelectric thin film 2 (AlN) and the first electrode layer 6a tends to be reduced, and the absolute value of the degree of lattice mismatch tends to be 2% or less. Although the free energy change ΔG in the oxidation reaction of the alloy represented by any of the following Chemical Formula 6A, Chemical Formula 6B, and Chemical Formula 6C is a negative value, the absolute value of the ΔG tends to be relatively small. Therefore, the alloy represented by any of the following Chemical Formula 6A, Chemical Formula 6B, and Chemical Formula 6C is difficult to be oxidized, and tends to suppress the dielectric breakdown in the piezoelectric thin film 2. The Gibbs energy change ΔG in the oxidation reaction of the alloy represented by any of the following Chemical Formula 6A, Chemical Formula 6B, and Chemical Formula 6C may be calculated from the known Ellingham diagram.

$$Mo_xW_yV_z \quad \text{Chemical Formula 6A}$$

where in the above Chemical Formula 6A, $0<x<1.0$, $0<y<0.90$, and $0<z<0.87$.

$$Mo_xW_yCr_z \quad \text{Chemical Formula 6B}$$

where in the above Chemical Formula 6B, $0<x<1.0$, $0<y<0.95$, and $0<z<0.46$.

$$Mo_xW_yNb_z \quad \text{Chemical Formula 6C}$$

where in the above Chemical Formula 6C, $0.35<x<1.0$, $0<y<0.65$, and $0<z<0.18$.

When the piezoelectric thin film 2 includes zinc oxide, the alloy included in the first electrode layer 6a may be represented by any one of the following Chemical Formula 7A and Chemical Formula 7B. When the alloy included in the first electrode layer 6a is represented by any one of the following Chemical Formula 7A and Chemical Formula 7B, a plurality of ZnO columnar crystals having the oriented (001) plane tend to grow uniformly on the (110) plane of the first electrode layer 6a; the lattice mismatch between the piezoelectric thin film 2 (ZnO) and the first electrode layer 6a tends to be reduced; and the absolute value of the degree of lattice mismatch tends to be 2% or less. Although the free energy change ΔG in the oxidation reaction of the alloy represented by any one of the following Chemical Formula 7A and Chemical Formula 7B is a negative value, the absolute value of the ΔG tends to be relatively small. Therefore, the alloy represented by any one of the following Chemical Formula 7A and Chemical Formula 7B is difficult to be oxidized, and tends to suppress the dielectric breakdown in the piezoelectric thin film 2. The Gibbs energy change ΔG in the oxidation reaction of the alloy represented by any one of the following Chemical Formula 7A and Chemical Formula 7B may be calculated from the known Ellingham diagram.

$$Mo_xW_yNb_z \quad \text{Chemical Formula 7A}$$

where in the above Chemical Formula 7A, $0<x<0.75$, $0<y<1.0$, and $0<z<1.0$.

$$Mo_xW_yTa_z \quad \text{Chemical Formula 7B}$$

where in the above Chemical Formula 7B, $0<x<0.75$, $0<y<1.0$, and $0<z<1.0$.

The substrate 12 may be, for example, a semiconductor substrate (such as silicon substrate or gallium arsenide substrate), an optical crystal substrate (such as sapphire substrate), an insulator substrate (such as glass substrate or ceramic substrate), or a metal substrate. The first electrode layer 6a may be laminated, for example, on the (100) plane of the substrate 12. The composition of the substrate used for other piezoelectric thin film devices described later may be the same as the composition of the substrate 12 shown in FIG. 1.

The first electrode layer 6a may be laminated directly on the substrate 12. With compared to the case where another electrode layer (for example, another electrode layer having a face-centered cubic lattice structure) intervenes between the first electrode layer 6a and the substrate 12, the body-centered cubic lattice structure of the first electrode layer 6a laminated directly on the substrate 12 is unlikely to be impaired, and the lattice mismatch between the first electrode layer 6a and the piezoelectric thin film 2 tends to be reduced. When the first electrode layer 6a having a body-centered cubic lattice structure is laminated directly on another electrode layer having a face-centered cubic lattice structure, the residual stress due to the difference in thermal expansion coefficients between both electrode layers tends to occur in any of the electrode layers. As a result, the first electrode layer 6a may be peeled off from another electrode layer, or the residual stress in the piezoelectric thin film 2 may be increased to induce a crack in the piezoelectric thin film 2.

An adhesion layer may intervene between the first electrode layer 6a and the substrate 12. The adhesion layer may be at least one selected from the group consisting of Mg (magnesium), Cu (copper), Al (aluminum), Ni (nickel), Cr (chromium), Ti (titanium), Hf (hafnium), Zr (zirconium), Nb (niobium), and Ta (tantalum). The adhesion layer may be a simple substance of metal, an alloy, or a compound (such as an oxide). The adhesion layer may be composed of another piezoelectric thin film, a polymer, or a ceramic. Due to the intervention of the adhesion layer, the (110) plane of the body-centered cubic lattice structure of the first electrode layer 6a tends to be oriented in the normal direction of the substrate 12. The adhesion layer also has a function of suppressing peeling of the first electrode layer 6a due to mechanical impact or the like. The adhesion layer may be rephrased as a support layer, a buffer layer, or an intermediate layer.

The second electrode layer 6b may be a simple substance of metal or may be an alloy. The second electrode layer 6b may include the same metal element as the first electrode layer 6a. The composition of the second electrode layer 6b may be exactly the same as that of the first electrode layer 6a. The composition of the second electrode layer 6b may be different from that of the first electrode layer 6a. For example, the second electrode layer 6b may be at least one selected from the group consisting of Pt (platinum), Ir (iridium), Pd (palladium), Au (gold), Mg (magnesium), Cu (copper), Al (aluminum), Ni (nickel), Cr (chromium), Ti (titanium), Hf (hafnium), Zr (zirconium), Nb (niobium), Ta (tantalum), Mo (molybdenum), W (tungsten), and V (vanadium).

The piezoelectric thin film 2 may include at least one additive element selected from the group consisting of Sc (scandium), Y (yttrium), and In (indium). The piezoelectric thin film 2 may include, as an additive element, at least one tetravalent element selected from the group consisting of Ti (titanium), Zr (zirconium), and Hf (hafnium). The piezoelectric thin film 2 may include Mg (magnesium) in addition to the above tetravalent element as an additive element. The piezoelectric thin film 2 may include, as an additive element, at least one pentavalent element selected from the group consisting of V (vanadium), Nb (niobium), and Ta (tantalum). The piezoelectric thin film 2 includes one or more of the above additive elements, and thereby the lattice constant of the wurtz type structure is adjusted, a large number of columnar crystals of piezoelectric compositions having the wurtz type structure are uniformly grown on the first electrode layer 6, and the piezoelectric characteristics of the piezoelectric thin film 2 may be improved.

The thickness of the substrate 12 may be, for example, 50 µm or more and 10000 µm or less. The thickness of the first electrode layer 6a may be, for example, 0.01 µm or more and 1 µm or less. The thickness of the piezoelectric thin film 2 may be, for example, 0.1 µm or more and 30 µm or less. The thickness of the second electrode layer 6b may be, for example, 0.01 µm or more and 1 µm or less.

Each of the first electrode layer 6a, the piezoelectric thin film 2, and the second electrode layer 6b may be, for example, individually formed according to the laminating order by sputtering using a plurality of targets (co-sputtering or multi-sputtering). A plurality of targets may include at least one of the elements constituting each layer or piezoelectric thin film described above. Depending on the selection and combination of targets having a predetermined composition, each of the first electrode layer 6a, the piezoelectric thin film 2, and the second electrode layer 6b having the intended composition can be formed individually. The composition of the sputtering atmosphere also influences the composition of each of the first electrode layer 6a, the piezoelectric thin film 2, and the second electrode layer 6b. For example, when the piezoelectric thin film 2 is formed from AlN, the sputtering atmosphere may be, for example, nitrogen gas. The sputtering atmosphere may be a mixed gas including a noble gas (for example, argon) and nitrogen. The input power (power density) provided to each of a plurality of targets is also a control factor of the composition and thickness of each of the first electrode layer 6a, the piezoelectric thin film 2, and the second electrode layer 6b. The target may be a simple substance of metal or may be an alloy. Total pressure of the sputtering atmosphere, partial pressure or concentration of source gas (for example, nitrogen) in the atmosphere, the duration of sputtering for each target, temperature of the substrate surface on which the piezoelectric thin film is formed, substrate bias, and the like are also control factors of each of composition and thickness of the first electrode layer 6a, the piezoelectric thin film 2, and the second electrode layer 6b. Etching (for example, plasma etching) may form a piezoelectric thin film having a desired shape or pattern.

The crystal structure of each of the first electrode layer 6a, the piezoelectric thin film 2, and the second electrode layer 6b may be identified by X-ray diffraction (XRD). The composition of each of the first electrode layer 6a, the piezoelectric thin film 2, and the second electrode layer 6b may be identified by at least any one analysis method of analysis methods using X-ray fluorescence analysis (XRF), energy dispersive X-ray analysis (EDX), inductively coupled plasma mass spectrometry (ICP-MS), laser ablation inductively coupled plasma mass spectrometry (LA-ICP-MS), and electron beam micro analyzer (EPMA).

The applications of the piezoelectric thin film device 10 according to the present embodiment are diverse. The piezoelectric thin film device may be, for example, a piezoelectric microphone, a harvester, an oscillator, a resonator, or an acoustic multilayer film. The piezoelectric thin film device may be, for example, a piezoelectric actuator. The piezoelectric actuator may be used, for example, for a head assembly, a head stack assembly, or a hard disk drive. The piezoelectric actuator may be used, for example, for a printer head or an inkjet printer apparatus. The piezoelectric actuator may be used for a piezoelectric switch. The piezoelectric thin film device may be, for example, a piezoelectric sensor. The piezoelectric sensor may be used, for example, for a gyro sensor, a pressure sensor, a pulse wave sensor, an ultrasonic sensor, or a shock sensor. Each piezoelectric thin film device described above may be a part or all of MEMS. For example, each of the piezoelectric thin film devices (10, 10b, 40) shown in (a) of FIG. 1, (b) of FIG. 1, and FIG. 2 may be a part of MEMS.

Hereinafter, each specific example of the piezoelectric thin film device will be described in detail.

The piezoelectric thin film device 10b shown in (b) of FIG. 1 may be a piezoelectric microphone comprising substrates 12a and 12b; a first electrode layer 6a disposed on the substrates 12a and 12b; a piezoelectric thin film 2 laminated on the first electrode layer 6a; and a second electrode layer 6b laminated on the piezoelectric thin film 2. Under the piezoelectric thin film 2, an acoustic cavity 12c may be provided.

The piezoelectric thin film device shown in FIG. 2 is a piezoelectric switch 40. The piezoelectric switch 40 comprises: a substrate 12C; a first switch 18A disposed on the surface of the substrate 12C; a first conductive terminal 3A disposed at the tip of the first switch 18A and facing the substrate 12C; a second conductive terminal 3B disposed on the surface of the substrate 12C and facing the first conductive terminal 3A; a second switch 18B disposed on the surface of the substrate 12C and spaced apart from the first switch 18A; the first conductive terminal 3C disposed at the tip of the second switch 18B and facing the substrate 12C; and a second conductive terminal 3D disposed on the surface of the substrate 12C and facing the first conductive terminal 3C. The first switch 18A has a first electrode layer 61, a second electrode layer 6J, and a piezoelectric thin film 2F sandwiched between the first electrode layer 61 and the second electrode layer 6J. The second switch 18B has a first electrode layer 6K, a second electrode layer 6L, and a piezoelectric thin film 2G sandwiched between the first electrode layer 6K and the second electrode layer 6L. Due to the operation of the first switch 18A, the piezoelectric thin film 2F is distorted, the tip of the first switch 18A approaches the surface of the substrate 12C, and the first conductive terminal 3A is connected to the second conductive terminal 3B. Due to the operation of the second switch 18B, the piezoelectric thin film 2G is distorted, the tip of the second switch 18B approaches the surface of the substrate 12C, and the first conductive terminal 3C is connected to the second conductive terminal 3D. The thickness of the piezoelectric thin film 2F that the first switch 18A has is thinner than the thickness of the piezoelectric thin film 2G that the second switch 18B has. Therefore, the closing voltage of the first switch 18A is different from the closing voltage of the second switch 18B.

EXAMPLES

Hereinafter, the present invention will be described in more detail with reference to Examples and Comparative Examples, but the present invention is not limited by these Examples.

Example 1

DC magnetron sputtering in a vacuum chamber directly formed an adhesion layer consisting of titanium oxide on the entire (100) plane of a silicon single crystal substrate. The thickness of the single crystal substrate was 625 µm. The thickness of the adhesion layer was $5 \times 10^{-3}$ µm.

DC magnetron sputtering in a vacuum chamber directly formed the first electrode layer on the entire surface of the adhesion layer. In the DC magnetron sputtering, sputtering of a plurality of single metal targets was simultaneously performed. As a target, a simple substance of each of metal element EX and metal element EY shown in the following Table 1 was used. The metal element EX in the case of Example 1 was V. The metal element EY in the case of Example 1 was Mo. In Example 1, the target of the metal element EZ was not used. The first electrode layer in Example 1 consisted of an alloy represented by the chemical formula $V_xMo_y$, and had a body-centered cubic (BCC) lattice structure. x is the molar ratio of V in the chemical formula $V_xMo_y$. y is the molar ratio of Mo in $V_xMo_y$. By adjusting the input power for each target, x and y were adjusted to the values shown in the following Table 1.

RF magnetron sputtering in a vacuum chamber directly formed a piezoelectric thin film consisting of AlN having a wurtz type structure on the entire surface of the first electrode layer. In the RF magnetron sputtering, a single aluminum target was used. The input power in the RF magnetron sputtering was 9.87 W/cm². The temperature of the substrate in the process of forming the piezoelectric thin film (film forming temperature) was maintained at 300° C. The atmosphere in the vacuum chamber in the process of forming the piezoelectric thin film was a mixed gas of argon and nitrogen. The pressure of the mixed gas in the vacuum chamber was adjusted to 0.30 Pa. The thickness of the piezoelectric thin film was adjusted to 1.3 µm.

The second electrode layer was formed directly on the entire surface of the piezoelectric thin film in the same manner as in the case of the first electrode layer. The composition of the second electrode layer was exactly the same as the composition of the first electrode. The thickness of the second electrode layer was exactly the same as the thickness of the first electrode.

The crystal structure of each of the first electrode layer and the piezoelectric thin film described above was identified by X-ray diffraction (XRD) method. The composition of each of the first electrode layer, the piezoelectric thin film, and the second electrode layer described above was analyzed by analysis methods of X-ray fluorescence analysis (XRF) and laser ablation inductively coupled plasma mass spectrometry (LA-ICP-MS). For the XRD method, a multipurpose X-ray diffractometer (SmartLab) manufactured by Rigaku Corporation was used. For the XRF method, an analyzer (ZSX-100e) manufactured by Rigaku Corporation was used. For the LA-ICP-MS method, an analyzer (7500s) manufactured by Agilent Technologies, Ltd. was used.

As described above, the laminate body was produced, comprising: the substrate; the adhesion layer laminated directly on the substrate; the first electrode layer laminated directly on the adhesion layer, the piezoelectric thin film laminated directly on the first electrode layer; and the second electrode laminated directly on the piezoelectric thin film. Subsequently, patterning of the laminated structure on the substrate was performed by photolithography. Subsequently, the entire laminated body was cut by dicing to obtain a square-shaped piezoelectric thin film device in Example 1. The piezoelectric thin film device comprised the substrate; the adhesion layer laminated directly on the substrate; the first electrode layer laminated directly on the adhesion layer, the piezoelectric thin film laminated directly on the first electrode layer; and the second electrode laminated directly on the piezoelectric thin film.

[Analysis of Piezoelectric Thin Film Device]

The piezoelectric thin film device in Example 1 was analyzed by the following method.

<Calculation of Degree of Lattice Mismatch Δa/a>

The degree of lattice mismatch Δa/a between the first electrode layer and the piezoelectric thin film was calculated. Δa/a in Example 1 was a value shown in the following Table 2.

<Calculation of ΔG>

The Gibbs energy change ΔG in the oxidation reaction of the V—Mo alloy constituting the first electrode layer in Example 1 was calculated from the known Ellingham diagram. ΔG in Example 1 was a value shown in the following Table 2.

<Measurement of Rocking Curve>

The rocking curve of the (400) plane of the silicon single crystal substrate used for producing the piezoelectric thin film device in Example 1 was measured. The above X-ray diffractometer was used for the measurement. The measurement range of the rocking curve was the diffraction angle±0.5° of the maximum value of the diffraction peak derived from the (400) plane of silicon. The measurement interval was 0.01°. The measurement speed was 2.0°/min. The full width at half maximum of the rocking curve of the (400) plane of the silicon single crystal substrate was 0.05°. Therefore, when the full width at half maximum of the rocking curve of the (002) plane of the piezoelectric thin film described later is 0.05° or more, it can be deemed that the full width at half maximum of the rocking curve of the piezoelectric thin film indicates the orientation of the (002) plane of the piezoelectric thin film.

The rocking curve of the (002) plane of the piezoelectric thin film (AlN) in Example 1 before the formation of the second electrode layer was measured. The measurement range of the rocking curve was the diffraction angle (36°) ±15° of the maximum value of the diffraction peak derived from the (002) plane of AlN. Except for this point, the rocking curve of the (002) plane of the piezoelectric thin film in Example 1 was measured in the same manner as in the case of the (400) plane of silicon. The full width at half maximum FWHM (wurt.) of the rocking curve of the (002) plane of the piezoelectric thin film in Example 1 was a value shown in the following Table 2.

<Calculation of Residual Stress σ>

The residual stress σ of the piezoelectric thin film provided in the piezoelectric thin film device in Example 1 was calculated by the following procedure. The curvature radius $R_{Before}$ of the substrate before the piezoelectric thin film was formed (that is, the laminate consisting of the substrate, the adhesion layer, and the first electrode layer) was measured. Subsequently, the curvature radius $R_{After}$ of the substrate after the piezoelectric thin film was formed (that is, the laminate consisting of the substrate, the adhesion layer, the first electrode layer, and the piezoelectric thin film) was measured. The measurement instrument (P-16 profiler) manufactured by KLA-Tencor Corporation was used for the measurement of each of $R_{Before}$ and $R_{After}$. The residual stress σ in Example 1 was calculated based on the following Formula 3 (Stony equation). The positive residual stress σ is a tensile stress, and the negative residual stress σ is a compressive stress. The residual stress σ in Example 1 was a value shown in the following Table 1.

[Formula 3]

$$\sigma = \frac{1}{6} \times \left( \frac{1}{R_{after}} - \frac{1}{R_{Before}} \right) \times \frac{E}{1-v} \times \frac{t_{sub.}^2}{t_{film}^2} \quad (3)$$

E in Formula 3 is the Young's modulus (unit: GPa) of a silicon single crystal substrate. v is the Poisson's ratio of the piezoelectric thin film. $t_{sub.}$ is the thickness of a silicon single crystal substrate. $t_{film}$ is the thickness of the piezoelectric thin film.

<Measurement of Crack Rate>

The 100 mm×100 mm plate-like piezoelectric thin film device in Example 1 was cut to prepare 100 samples of 10 mm square. Among the 100 samples, the number n of the samples in which a crack occurred in the piezoelectric thin film was counted by an optical microscope. The crack rate (that is, n %) in Example 1 was a value shown in the following Table 1.

<Calculation of Electro-Mechanical Coupling Coefficient $k_t^2$>

The resonant frequency $f_r$ and the antiresonant frequency $f_a$ of the piezoelectric thin film device in Example 1 were measured. The resonant frequency $f_r$ is a frequency when the impedance of the resonant circuit using the piezoelectric thin film device is minimum. The antiresonant frequency $f_a$ is a frequency when the impedance of the resonant circuit using the piezoelectric thin film device is maximum. The details of the measurement of the resonant frequency $f_r$ and the antiresonant frequency $f_a$ were as follows:

Measurement instrument: network analyzer (N5244A) manufactured by Agilent Technologies, Ltd.
Probe: GS 500 μm (ACP 40-W-GS-500 manufactured by Cascade Microtech, Ltd.)
Power: −10 dBm
Measurement pitch: 0.25 MHz
Electrode area: 200×200 μm²
S11 measurement (reflection measurement)

The electro-mechanical coupling coefficient $k_t^2$ (unit: %) was calculated from the measured values of the resonant frequency $f_r$ and the antiresonant frequency $f_a$ based on the following Formula 4. Any of the resonant frequency $f_r$ and the antiresonant frequency $f_a$ used to calculate the electro-mechanical coupling coefficient $k_t^2$ were obtained from 5-point measurement average values. The electro-mechanical coupling coefficient $k_t^2$ in Example 1 was a value shown in the following Table 1.

[Formula 4]

$$k_t^2 = \frac{f_a^2 - f_r^2}{f_a^2} \quad (4)$$

<Measurement of Piezoelectric Constant $d_{33}$>

The piezoelectric constant $d_{33}$ (unit: pC/N) of the piezoelectric thin film in Example 1 was measured. The details of the measurement of the piezoelectric constant $d_{33}$ were as follows. The piezoelectric constant $d_{33}$ (3-point measurement point average value) in Example 1 was a value shown in the following Table 1.

Measurement instrument: $d_{33}$ meter (ZJ-4B) manufactured by Chinese Academy of Sciences
Frequency: 110 Hz
Clamping pressure: 0.25 N <Measurement of Insulation Resistivity IR>

The insulation resistivity IR of the piezoelectric thin film in Example 1 was measured. For the measurement of IR, a measurement instrument (R8340A) manufactured by ADVANTEST Ltd. was used. In the measurement of insulation resistivity IR, an electric field of 1 V/μm was applied to the piezoelectric thin film. As described above, the thickness of the piezoelectric thin film was 1.3 μm. The area of the portion to which the electric field was applied in each of the first electrode layer and the second electrode layer was 600×600 μm². The insulation resistivity IR in Example 1 was a value shown in the following Table 1.

Examples 2 to 11

In the production of the first electrode layer in each of Examples 2 to 11, as shown in the following Table 1, targets of at least two single metals of the metal elements EX, EY, and EZ were used. The first electrode layer in each Example is represented by a general chemical formula $EX_xEY_yEZ_z$. x is a molar ratio of the metal element EX in the chemical formula $EX_xEY_yEZ_z$. y is a molar ratio of the metal element EY in the chemical formula $EX_xEY_yEZ_z$. z is a molar ratio of the metal element EZ in the chemical formula $EX_xEY_yEZ_z$. The composition of the first electrode layer in each of Examples 2 to 11 is shown in the following Table 1. Each of the first electrode layers in Examples 2 to 11 consisted of an alloy having a body-centered cubic lattice structure. In Examples 10 and 11, sputtering of a single zinc target was performed in an oxidizing atmosphere to produce a piezoelectric thin film consisting of ZnO.

The piezoelectric thin film device in each of Examples 2 to 11 was individually produced in the same manner as in Example 1 except for the above matters.

The piezoelectric thin film device in each of Examples 2 to 11 was analyzed in the same manner as in Example 1. The result of the analysis in each of Examples 2 to 11 is shown in the following Table 2.

Comparative Examples 1 to 5

In the production of the first electrode layer in each of Comparative Examples 1 to 5, as shown in the following Table 1, only a target of one single metal of the metal elements EX, EY, and EZ was used. The composition of the first electrode layer in each of Comparative Examples 1 to 5 is the same single metal as the target as shown in the following Table 1. The crystal structure of the first electrode layer in each of Comparative Examples 1 to 5 was the body-centered cubic lattice (BCC) structure. In Comparative Example 5, sputtering of a single zinc target was performed in an oxidizing atmosphere to produce a piezoelectric thin film consisting of ZnO.

The piezoelectric thin film device in each of Comparative Examples 1 to 5 was individually produced in the same manner as in Example 1 except for the above matters.

The piezoelectric thin film device in each of Comparative Examples 1 to 5 was evaluated in the same manner as in Example 1. The evaluation result of each of Comparative Examples 1 to 5 is shown in the following Table 2.

It is preferable that the degree of lattice mismatch $\Delta a/a$ be 2% or less, which is a desired value.

It is preferable that the full width at half maximum FWHM (wurt.) of the rocking curve be 2.0° or less, which is a desired value.

It is preferable that the crack rate be 1% or less, which is a desired value.

It is preferable that the electro-mechanical coupling coefficient $k_t^2$ be 6% or more, which is a desired value.

It is preferable that the piezoelectric constant $d_{33}$ be 6.0 pC/N or more, which is a desired value.

It is preferable that the insulation resistivity IR be $1.0 \times 10^{13}$ Ω·cm or more, which is a desired value.

Quality A in the following Table 2 means that all desired values of the 5 evaluation items of FWHM (wurt.), crack rate, $k_t^2$, $d_{33}$, and IR were achieved.

Quality B in the following Table 2 means that desired values of the 3 or 4 evaluation items of $\Delta a/a$, FWHM (wurt.), crack rate, $k_t^2$, $d_{33}$, and IR were achieved.

The quality C in the following Table 2 means that the number of the evaluation item for which the desired value was achieved was 2 or less.

TABLE 1

| | First electrode layer: $EX_xEY_yEZ_z$ | | | | | | Crystal structure of the first electrode layer | Piezoelectric thin film |
|---|---|---|---|---|---|---|---|---|
| | EX | x | EY | y | EZ | z | x + y + z | | |
| Example 1 | V | 0.30 | Mo | 0.70 | None | 0.00 | 1.00 | BCC | AlN |
| Example 2 | V | 0.50 | None | 0.00 | W | 0.50 | 1.00 | BCC | AlN |
| Example 3 | V | 0.40 | Mo | 0.40 | W | 0.20 | 1.00 | BCC | AlN |
| Example 4 | V | 0.25 | Mo | 0.70 | W | 0.05 | 1.00 | BCC | AlN |
| Example 5 | None | 0.00 | Mo | 0.50 | W | 0.50 | 1.00 | BCC | AlN |
| Example 6 | Cr | 0.05 | Mo | 0.90 | W | 0.05 | 1.00 | BCC | AlN |
| Example 7 | Cr | 0.10 | Mo | 0.45 | W | 0.45 | 1.00 | BCC | AlN |
| Example 8 | Nb | 0.05 | Mo | 0.80 | W | 0.15 | 1.00 | BCC | AlN |
| Example 9 | Nb | 0.10 | Mo | 0.80 | W | 0.10 | 1.00 | BCC | AlN |
| Example 10 | Nb | 0.60 | Mo | 0.20 | W | 0.20 | 1.00 | BCC | ZnO |
| Example 11 | Ta | 0.60 | Mo | 0.20 | W | 0.20 | 1.00 | BCC | ZnO |
| Comparative Example 1 | None | 0.00 | None | 0.00 | W | 1.00 | 1.00 | BCC | AlN |
| Comparative Example 2 | Cr | 1.00 | None | 0.00 | None | 0.00 | 1.00 | BCC | AlN |
| Comparative Example 3 | V | 1.00 | None | 0.00 | None | 0.00 | 1.00 | BCC | AlN |
| Comparative Example 4 | Nb | 1.00 | None | 0.00 | None | 0.00 | 1.00 | BCC | AlN |
| Comparative Example 5 | Cr | 1.00 | None | 0.00 | None | 0.00 | 1.00 | BCC | ZnO |

TABLE 2

| | $\Delta a/a$ [%] | $\Delta G$ [kJ/mol] | FWHM (wurt.) [deg.] | σ [GPa] | Crack rate [%] | $k_t^2$ [%] | $d_{33}$ [pC/N] | IR [Ω·cm] | Quality |
|---|---|---|---|---|---|---|---|---|---|
| Example 1 | 0.00 | −464.56 | less than 1.0 | 0.09 | less than 1.0 | 6.5 | 7.0 | 10^15 | A |
| Example 2 | −0.04 | −539.56 | less than 1.0 | −0.01 | less than 1.0 | 6.5 | 7.1 | 10^14 | A |
| Example 3 | −0.09 | −498.93 | less than 1.0 | −0.14 | less than 1.0 | 6.4 | 6.8 | 10^15 | A |
| Example 4 | 0.26 | −456.79 | less than 1.0 | 0.77 | less than 1.0 | 6.3 | 6.6 | 10^14 | A |
| Example 5 | 1.83 | −430.50 | 2.1 | 4.80 | 6 | 6.0 | 6.1 | 10^14 | B |
| Example 6 | 0.79 | −414.56 | less than 1.0 | 2.11 | less than 1.0 | 6.4 | 6.9 | 10^15 | A |
| Example 7 | 0.94 | −451.95 | 1.0 | 2.51 | 3 | 6.3 | 6.8 | 10^15 | B |
| Example 8 | 1.58 | −421.53 | 1.6 | 4.17 | 5 | 6.2 | 6.6 | 10^14 | B |
| Example 9 | 1.76 | −431.39 | 2.0 | 4.62 | 5 | 6.1 | 6.4 | 10^13 | B |
| Example 10 | −0.09 | −567.60 | less than 1.0 | −0.07 | less than 1.0 | 8.5 | 11.8 | 10^10 | B |
| Example 11 | 0.05 | −601.25 | less than 1.0 | 0.05 | less than 1.0 | 8.3 | 12.0 | 10^11 | B |
| Comparative Example 1 | 2.52 | −461.88 | 2.5 | 6.58 | 7 | 6.0 | 6.3 | 10^15 | C |
| Comparative Example 2 | −7.85 | −645.00 | With non (001) plane | −20.18 | 15 | 3.0 | 2.8 | 10^10 | C |

TABLE 2-continued

| | Δa/a [%] | ΔG [kJ/mol] | FWHM (wurt.) [deg.] | σ [GPa] | Crack rate [%] | $k_t^2$ [%] | $d_{33}$ [pC/N] | IR [Ω·cm] | Quality |
|---|---|---|---|---|---|---|---|---|---|
| Comparative Example 3 | −2.73 | −617.25 | 2.8 | −6.95 | 8 | 5.8 | 5.2 | 10^12 | C |
| Comparative Example 4 | 5.81 | −659 | 8.0 | 15.07 | 10 | 2.6 | 2.9 | 10^12 | C |
| Comparative Example 5 | −12.74 | −645 | With non (001) plane | −11.49 | 10 | 1.8 | 3.2 | 10^4 | C |

INDUSTRIAL APPLICABILITY

According to the present invention, provided is a piezoelectric thin film device (for example, MEMS) in which lattice mismatch between a piezoelectric thin film and a lower electrode layer (first electrode layer) is reduced.

REFERENCE SIGNS LIST 2, 2F, and 2G: piezoelectric thin film; 3A and 3C: first conductive terminal; 3B and 3D: second conductive terminal; 6a, 6I, and 6K: first electrode layer; 6b, 6J, and 6L: second electrode layer; 10: piezoelectric thin film device; 10b: piezoelectric thin film device (piezoelectric microphone); 12, 12a, 12b, and 12c: substrate; 18A: first switch; 18B: second switch; 40: piezoelectric switch.

The invention claimed is:

1. A piezoelectric thin film device comprising: a substrate; a first electrode layer; and a piezoelectric thin film laminated directly on the first electrode layer, wherein the first electrode layer includes an alloy composed of two or more metal elements; the first electrode layer has a body-centered cubic lattice structure; and the piezoelectric thin film has a wurtzite structure; and the first electrode layer having the body-centered cubic lattice structures is laminated directly on the substrate, wherein the alloy has the body-centered cubic lattice structure; and the first electrode layer consists of only the alloy having the body-centered cubic lattice structure.

2. The piezoelectric thin film device according to claim 1, wherein
the alloy includes two or more elements selected from the group consisting of Mo, W, V, Cr, Nb, and Ta.

3. The piezoelectric thin film device according to claim 2, wherein
the alloy is represented by any of the following Chemical Formula 3A, Chemical Formula 3B, Chemical Formula 3C, Chemical Formula 3D, Chemical Formula 3E, and Chemical Formula 3F; and
the piezoelectric thin film includes aluminum nitride:

$Mo_{(1-x)}W_x$      Chemical Formula 3A where in the Chemical Formula 3A, 0<x<0.65;

$Mo_{(1-x)}V_x$      Chemical Formula 3B where in the Chemical Formula 3B, 0<x<0.82;

$Mo_{(1-x)}Nb_x$      Chemical Formula 3C where in the Chemical Formula 3C, 0<x<0.18;

$W_{(1-x)}V_x$      Chemical Formula 3D where in the Chemical Formula 3D, 0.10<x<0.87;

$Mo_{(1-x)}Cr_x$      Chemical Formula 3E where in the Chemical Formula 3E, 0<x<0.37; and $W_{(1-x)}Cr_x$      Chemical Formula 3F where in the Chemical Formula 3F, 0.05<x<0.46.

4. The piezoelectric thin film device according to claim 2, wherein
the alloy is represented by any of the following Chemical Formula 4A, Chemical Formula 4B, Chemical Formula 4C, Chemical Formula 4D, and Chemical Formula 4E; and
the piezoelectric thin film includes zinc oxide:

$Mo_{(1-y)}W_y$      Chemical Formula 4A where in the Chemical Formula 4A, 0.90<y<1.0;

$Mo_{(1-y)}Nb_y$      Chemical Formula 4B where in the Chemical Formula 4B, 0.25<y<1.0;

$Mo_{(1-y)}Ta_y$      Chemical Formula 4C where in the Chemical Formula 4C, 0.25<y<1.0;

$W_{(1-y)}Nb_y$      Chemical Formula 4D where in the Chemical Formula 4D, 0<y<1.0; and $W_{(1-y)}Ta_y$      Chemical Formula 4E where in the Chemical Formula 4E, 0<y<1.0.

5. The piezoelectric thin film device according to claim 1, wherein
the alloy includes three or more elements selected from the group consisting of Mo, W, V, Cr, Nb, and Ta.

6. The piezoelectric thin film device according to claim 5, wherein
the alloy is represented by any of the following Chemical Formula 6A, Chemical Formula 6B, and Chemical Formula 6C; and
the piezoelectric thin film includes aluminum nitride:

$Mo_xW_yV_z$      Chemical Formula 6A where in the Chemical Formula 6A, 0<x<1.0, 0<y<0.90, and 0<z<0.87;

$Mo_xW_yCr_z$      Chemical Formula 6B where in the Chemical Formula 6B, 0<x<1.0, 0<y<0.95, and 0<z<0.46; and $Mo_xW_yNb_z$      Chemical Formula 6C where in the Chemical Formula 6C, 0.35<x<1.0, 0<y<0.65, and 0<z<0.18.

7. The piezoelectric thin film device according to claim 5, wherein
the alloy is represented by any one of the following Chemical Formula 7A and Chemical Formula 7B; and
the piezoelectric thin film includes zinc oxide:

$Mo_xW_yNb_z$      Chemical Formula 7A where in the Chemical Formula 7A, 0<x<0.75, 0<y<1.0, and 0<z<1.0; and $Mo_xW_yTa_z$      Chemical Formula 7B where in the Chemical Formula 7B, 0<x<0.75, 0<y<1.0, and 0<z<1.0.

8. The piezoelectric thin film device according to claim 1, wherein
a (110) plane of the body-centered cubic lattice structure of the first electrode layer is oriented in a normal direction of an interface between the first electrode layer and the piezoelectric thin film.

9. The piezoelectric thin film device according to claim 1, wherein
a degree of lattice mismatch between the first electrode layer and the piezoelectric thin film is 0% or more and 2% or less.

10. The piezoelectric thin film device according to claim 1, wherein
a full width at half maximum of a rocking curve of a (002) plane of the wurtzite structure of the piezoelectric thin film is 0° or more and 2.0° or less.

11. The piezoelectric thin film device according to claim 1, wherein
a free energy change ΔG in an oxidation reaction of the alloy is a negative value and −601.25 kJ/mol or more.

12. The piezoelectric thin film device according to claim 1, wherein
an insulation resistivity of the piezoelectric thin film to which an electric field of 1 V/μm is applied is $1.0 \times 10^{11}$ Ω·cm or more.

13. The piezoelectric thin film device according to claim 1, wherein a piezoelectric constant $d_{33}$ of the piezoelectric thin film is 6.0 pC/N or more.

* * * * *